United States Patent [19]

Kawanabe et al.

[11] Patent Number: 5,446,244
[45] Date of Patent: Aug. 29, 1995

[54] PRINTED WIRING PATTERN

[75] Inventors: Masatoshi Kawanabe; Kenichi Sowa; Akihisa Mori; Tomoyuki Sawada, all of Kanagawa, Japan

[73] Assignee: Toyo Communication Equipment Co., Ltd., Kanagawa, Japan

[21] Appl. No.: 635,497

[22] PCT Filed: Jul. 19, 1990

[86] PCT No.: PCT/JP90/00929
§ 371 Date: Dec. 12, 1990
§ 102(e) Date: Dec. 12, 1990

[51] Int. Cl.⁶ .............. B23K 101/42; B23K 31/12
[52] U.S. Cl. .................. 174/261; 228/105; 228/180.21
[58] Field of Search ............ 228/105, 103, 180.21; 174/263; 361/403, 409, 760, 779

[56] References Cited

U.S. PATENT DOCUMENTS

| | | | |
|---|---|---|---|
| 3,701,076 | 10/1972 | Irish | 361/409 |
| 4,893,216 | 1/1990 | Hagner | 228/180.2 |
| 5,088,008 | 2/1992 | Takeyama et al. | 361/403 |
| 5,224,022 | 6/1993 | Weigler et al. | 228/180.21 |

FOREIGN PATENT DOCUMENTS 1-205497  8/1989  Japan .

OTHER PUBLICATIONS

Abstract of JA 1-19788(A), Jan. 1989.
*IBM Tech. Discl. Bull.*, vol. 34, No. 3, Aug. 1991, pp. 361–362.

*Primary Examiner*—P. Austin Bradley
*Assistant Examiner*—Jeffrey T. Knapp
*Attorney, Agent, or Firm*—Koda and Androlia

[57] ABSTRACT

A printed wiring pattern for preventing poorly soldered connection that tends to occur when soldering surface mounting chip components and lead terminals of mounting components on the printed wiring pattern is capable of making the detection of a poorly soldered site a simple task.

3 Claims, 3 Drawing Sheets

PRINTED WIRING PATTERN

TECHNICAL FIELD

The present invention relates to a printed wiring pattern and, more particularly to a printed wiring pattern for preventing poorly soldered connections likely to occur when surface mounting chip components and lead terminals of mounting components on the printed wiring pattern are soldered by reflow method and for being capable of detecting easily poorly soldered connection sites.

BACKGROUND OF THE INVENTION

When mounting components such as flat package type IC, for example, QFP (Quadrate Flat Package) on a printed wiring pattern of a substrate, every connection between each pattern and its corresponding lead terminal is typically soldered in the following way: there are a number of the tips of lead terminals like crank legs protruding outward from the peripheries of ICs, and also there are formed a plurality of rectangular patterns (pads), the locations of which are preliminarily so determined that the patterns correspond to their lead terminals respectively, and lead terminals are placed on their corresponding patterns (pads). As a soldering method, a proper amount of soldering cream is printed and performed, a lead terminal is placed on the soldering cream, and heated to melt the soldering cream, and later cooled to be solidified. This reflow method is mostly practiced.

However, there are various causes such as variation in the length of a lead terminal protruding downward and poor contact between the lead terminal and a pattern at the time of soldering so that they may make solder solidified in such a situation that the lead terminal is remote from the pattern or the solder after solidifying.

Namely, FIG. 7(a) and (b) are illustrative views for comparing the cases between appropriate soldering and poor soldering and top views of mounting practice. The soldering cream printed on a pattern to is molten by heating thereof, and molten solder moves toward a lead terminal 4 due to capillary attraction. Thus, the molten solder is cooled to be solidified. When each lead terminal 4 of an IC 3 is connected by solder 5 to each pattern 2 on a substrate 1, in the Figure the lead terminal 4 on the right side has a good contact and is soldered well on the pattern 2. Whereas, if the lead terminal 4 does not contact with the pattern 2 before the soldering cream is molted by heat, the molten solder does not move toward the lead terminal 4 because capillary attraction caused by the lead terminal 4 does not affect the molten solder 5. Therefore, the molten solder 5 is solidified on the pattern 2 with uniform thickness. Accordingly, the lead terminal 4 on the left side is completely separated by not only the pattern 2 but also the solder 5.

In fact, there are intermediate cases between these extremes such that both of them are poorly soldered so that these insufficient soldered connections may be often the potential cause of making the lead terminal separated later.

Previously, there has been the difficulty of finding the case of such a poorly soldered connection. That is, formerly poorly soldered connections have been checked by visual inspection from the side of a substrate, and when the poorly soldered connection has been found, then it has been resoldered by soldering iron, resulting in soldering being completed as such. But it is very difficult to detect precisely such a case as being separated and poorly soldered connecting only by observing visually. In particular, it is impossible detecting the cases where both of them are just only slightly separated and no or extremely insufficient soldered connection is still formed though there could seem certain contact.

Since an electronic device cannot work naturally because of missing detecting a poorly soldered connection, the checking operation is critical and required to be perfect with no missing. However, as described above, missing will always take place due to such possible reason and it may happen that the electronic device does not work well after delivery as commercial goods.

Therefore, it is an object of the present invention to provide a printed wiring pattern in which there can be easily detected poorly soldered connection between the printed pattern and the lead terminal of an IC with visual inspection or an automatic checking method.

DISCLOSURE OF THE INVENTION

To achieve the object described above, a feature of the present invention resides in a printed wiring pattern in which there is provided, in the printed wiring pattern on which a mounting component such as a flat package IC is placed, distinguishing means such as a minute slit or a hole having a small area at such a position as to avoid an inspection obstruction of a mounting component such as a lead terminal.

Further, in another aspect according to another embodiment to achieve the object described above, the other feature of the present invention resides in the printed wiring pattern in which there is provided, in the printed wiring pattern on which a mounting component is placed, a tip of the printed wiring pattern such that the tip is separated by a minute slit at such a area as to avoid an inspection obstruction of the mounting component such as a lead terminal.

Furthermore, in still another aspect according to another embodiment to achieve the object described above, the other feature of the present invention resides in the printed wiring pattern in which there is capable of detecting a poorly soldered connection by means of judging good or poor soldering of a connection between the pattern and the lead terminal of a mounting component on the basis of whether or not a soldering bridge is formed over a minute slit of the printed pattern after finishing soldering operation such as meeting and fixing a solder by reflow method.

BEST MODE FOR EMBODYING THE INVENTION

Figure 1:
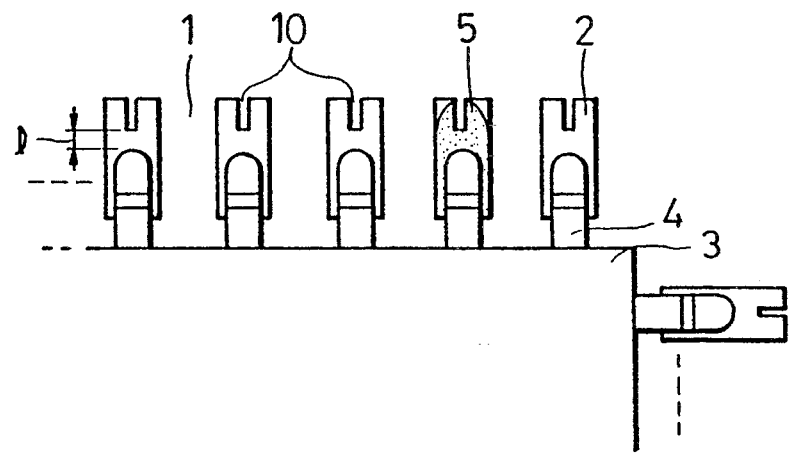
FIG. 1, FIG. 2 and FIG. 3 are illustrative views for printed wiring pattern arrangements in a first, a second and a third embodiment in accordance with the present invention.

Hereinafter, printed wiring patterns in accordance with the present invention will be described in details referring to the drawings.

In FIG. 1, there is shown a first embodiment of the present invention, where the same part is indicated by the same number and duplicated explanation will be avoided.

The arrangement in accordance with the present invention is characterized in that in a pattern 2 there is provided a narrow, minute slit (distinguishing means) 10 at a given distance of 1 from the tip (edge in external diameter direction) of a lead terminal 4 to outside diameter in lengthwise direction of the pattern 2. That is to say, the arrangement is characterized in that there is formed the minute slit 10 with the determined length from the external edge of the pattern 2 in lengthwise direction of the pattern 2.

Figure 2:
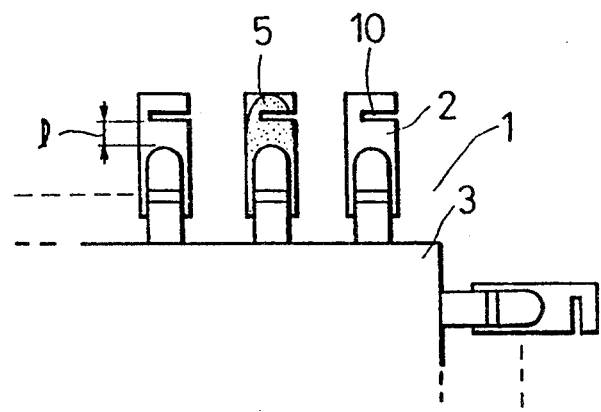

In FIG. 2, there is shown a second embodiment of the present invention. In this embodiment there is provided a narrow, minute slit (distinguishing means) 10 having a determined length on a side end portion of the pattern 2. Each of the minute slits 10 is formed so that the minute slits 10 is located at a determined distance of 1 from the tip of a lead terminal 4 (on the opposite end of IC 3) in crosswise direction of the pattern 2. This minute slit 10 is formed on a side end portion of the pattern 2 at a determined distance from an external edge of the pattern 2 in crosswise direction.

In these embodiments described above, the minute slits 10 are all linear, and they are formed parallel to either lengthwise or crosswise direction of the pattern 2, but they are just examples only. Thus, they may be curved lines, bent lines, irregular lines and the like, and they may also be lines formed at a determined angle, not parallel to either lengthwise or crosswise direction of pattern 2.

Further, in FIG. 1, though each one of the minute slits 10 is formed on the mid section in a crosswise direction of a pattern 2, it can be offset from the central position in either side. And it is possible to form the minute slit having branch portions, such as a "Y" shaped minute slit. In addition, a slit 10 shown in FIG. 1 may be formed directly under the tip of a lead terminal (without a given distance of 1). Again, minute slits shown in FIG. 1 and FIG. 2 may be combined to give a slit like form. Even if a slit is other than those described above, any arrangement for forming distinguishing means such as slit and hole to identify an arrival head of molten solder in pattern 2 may be included in the scope of the present invention.

Since each one of the patterns 2 includes the minute slit 10 which is formed so that conductive material used for the pattern 2 is not formed at a prescribed area on the substrate 1, an upper surface of the substrate 1 is exposed through the minute slit 10. The exposed surface of the substrate has a different color, design, and the like (distinguishing difference) from the pattern 2, and it is necessary to be easy to distinguish one from the other by visual observation or other detecting means.

However, in visual checking, because of the following description, it is necessary for a minute slit 10 to be wide enough to identify visually the exposed surface of a substrate as well as to be so minute that molten solder can flow over the slit 10 to the opposite side to give a bridge thereon by surface tension of the molten solder located at both sides of the minute slit 10. Such an order as, for example, 0.2 mm as a proper width is sufficient to meet the requirement. The width narrower than this may be made by using laser beam machining, but this order is a limitation which is achieved by the present fine machining technique. This point is the same for a fifth embodiment described later.

Figure 3:
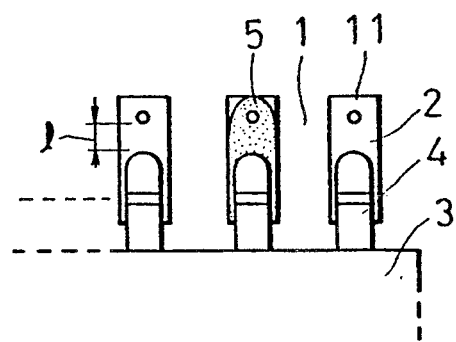

In FIG. 3, there is shown a third embodiment in accordance with the present invention, this arrangement is different from the other embodiment described above such that there is provided a hole (distinguishing means) 11 at a determined distance of 1 from the tip of a lead terminal 4 to outside diameter (on the opposite end of IC 3). Any hole may be used such as a circle, an ellipse, a polygon, an irregular shape, but in the same manner as previously described, the hole 11 is needed to be sufficiently large to distinguish between a pattern and a substrate, as well as to be so minute that molten solder can flow over the hole to the opposite side to give a bridge thereon by surface tension of the molten solder located around the hole 11.

Figure 4:
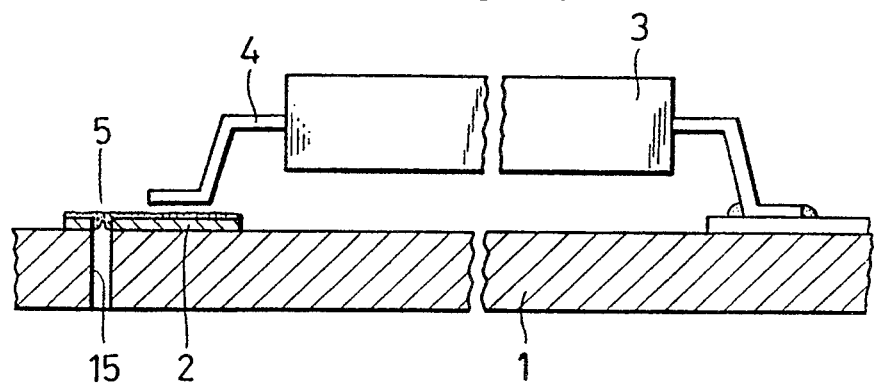
FIG. 4 is an illustrative view for developing solder in the case of forming a through hole.

Furthermore, described as a fourth embodiment is an arrangement characterized in that there is provided a through hole (distinguishing means) penetrating through a substrate 1 to its opposite surface in place of a hole 11 shown in FIG. 3. That is, as shown in FIG. 4, in the case of forming the through hole 15, it is possible to distinguish boundaries between the through hole 15 and the pattern 2.

Figure 6:
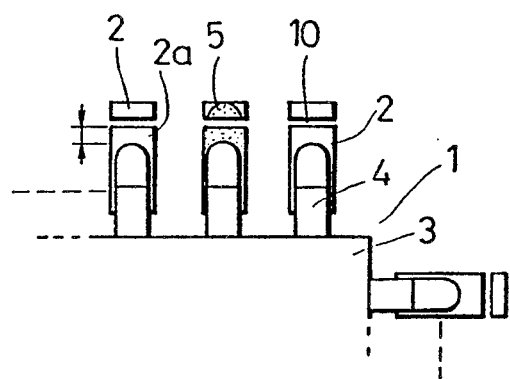
FIG. 6 is an illustrative view for an arrangement in a fifth embodiment in accordance with the present invention.
Figure 7A:
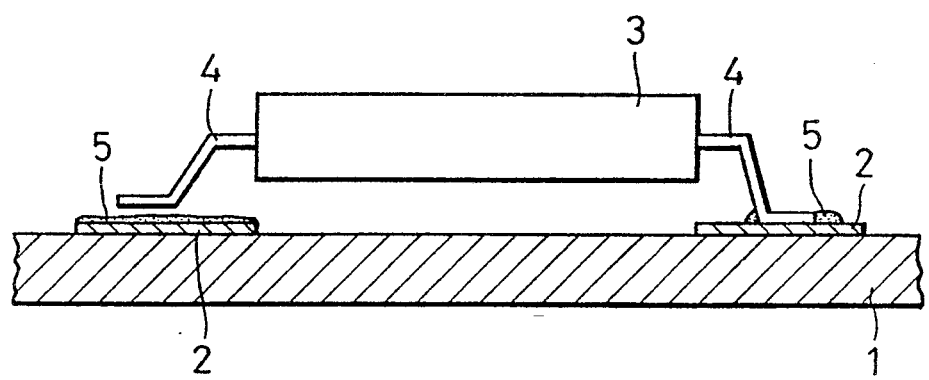
FIG. 7(a) and (b) are illustrative views for comparing the cases between appropriate soldering and poor soldering and top views of mounting practice.
Figure 7B:
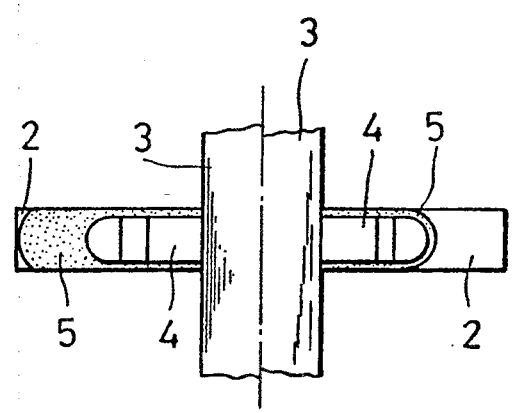

Next, in FIG. 6, there is shown a fifth embodiment in accordance with the present invention.

In the pattern 2 of this embodiment an arrangement is characterized in that there is provided a narrow, minute slit (distinguishing means) 10 formed at a determined distance of 1 from the tip (edge in external diameter direction) of a lead terminal 4 to outside diameter in crosswise direction of the pattern 2. This results in an arrangement in which regions, 2a and 2b are perfectly separated by the minute slit 10 as a border.

In the above described embodiment, the minute slit is linear and it is formed parallel to crosswise direction of the pattern 2, but this is just an example only. Thus, slits may be curved lines, bent lines, irregular lines and the like, and they may also be lines formed at a given angle, not parallel to crosswise direction of the pattern 2. Since each one of the patterns 2 includes the minute slit 10 which is formed so that conductive material used for the pattern 2 is not formed at a prescribed area on the substrate 1, an upper surface of the substrate 1 is exposed through the minute slit 10. The exposed surface of a substrate 1 has a color, a design and the like different (distinguishable difference) from those of the pattern 2, and it is necessary to be easy to distinguish one from the other by visual observation or other detecting means.

Further, in an automatic continuity described later in the place of visual inspection, a slit may be made narrower by etching such as making use of laser beam, and the narrower one may be rather preferable as the slit 10 because the solder bridge over the distinguishing means is easily formed by combining the molten solder surrounding the minute slit 10, the hole 11, or the through hole 15 due to surface tension. As a result, a poorly soldered connection is easily found out by checking.

In the above-described embodiments, any arrangement of the shape or position of the distinguishing means can be used as long as the bridge of the molten solder is formed over the distinguishing means when a poorly soldered connection exists between the pattern 2 and the lead terminal 4.

Of course, it is necessary for the position of such a matter as slit to be so located that obstructions such as lead terminal 3 and IC body 3 (the obstructions to inspection) are avoided since it is the object of distinguishing operation by visual inspection as described below.

Such an arrangement as described above of a pattern wiring in accordance with the present invention is originated on the basis of having found the following phenomena.

Figure 5A:
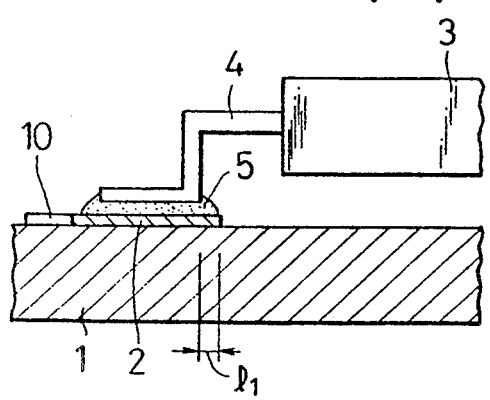
FIG. 5(a) and (b) are illustrative views for showing checking method of well or poorly soldered connection in accordance with the present invention.

That is, FIG. 5(a) shows a sectional view of FIG. 1 showing the state of solder in the case of well-soldered connection between the pattern 2 and the lead terminal: as shown in FIG. 5(a), in the case where the distance between the bottom surface of the terminal 4 and the upper surface of the pattern 2 is proper, the molten solder 5 which becomes a liquid phase from a solid phase (the solder cream) by heat moves toward the terminal 4 due to capillary attraction. Then, the molten solder 5 is cooled and solidified in such a way that the mass of the solder is accumulated and concentrated around the lead terminal 4, and only a small amount of the solder 5 squeezes out of around the contact outward. The squeezed out solder 5 at the side of the tip of the lead terminal does not reach the minute slit 10 located at a given distance of l. The color of the pattern 2 is about the same as that of the solder 5 generally or is difficult to distinguish with it so that the exposed surface of the substrate can be identified through the minute slit 10 unless the solder 5 flows expandably over the minute slit 10. Therefore, when the existence of the minute slit 10 is identified in checking after mounting of IC 3, well soldered connection between the pattern 2 and the lead terminal 4 is ascertained definitely. The amount of the solder 5 spread toward the minute slit 10 can be limited by adjusting an amount $l_1$ of protrusion in the internal direction of the pattern 2 preliminarily according to an amount of solder used.

Figure 5B:
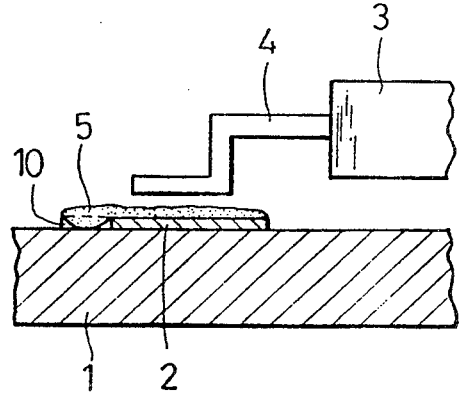

FIG. 5(b) shows another sectional view of FIG. 1 showing the molten solder in the case of poorly soldered connection between a pattern 2 and a lead terminal 4: as well known, the molten solder 5 cannot spread outward the pattern 2 formed by conductive material due to capillary attraction in case that the amount of molten solder is proper. As shown in FIG. 5(b), the distance between the bottom surface of the terminal 4 and the upper surface of the pattern 2 is improper, the molten solder 5 which becomes a liquid phase from a solid phase (the solder cream) by heat spread all over the pattern 2 without the molten solder 5 cohering around the bottom surface of the terminal 4 by capillary attraction. As a result, the molten solder 5 is in existence around the minute slit 10.

The width of a minute slit 10 is, as described above, set so narrow that molten solder can go on over the minute slit 10 by surface tension of the molten solder 5, and therefore solder 5 veils all or part of the slit to cover the substrate 1. As an inspector can verify a poorly soldered connection between the pattern 2 and the lead terminal 4 definitely by discerning whether the upper surface of the substrate 1 can be seen through the minute slit 10 or not.

As a checking method in an embodiment in FIG. 6, conducting checks can be performed between the regions 2a and 2b separated by the slit using checking apparatus other than visual inspection to increase efficiency. In this case, no matter how narrow the width of the minute slit 10 may be, there is no harm, but if it is considered that the narrower the width is the easier the molten solder goes on over the slit to form a bridge as a merit, higher precision can be achieved with apparatus than that of visual inspection.

Also, as means for judging whether soldering state is good or poor, light is directed to the minute slit, the magnitude of reflected light from it or characteristic indication such as phase is monitored, and the existence of the slit is detected, and as such can be achieved with the checking time shortened for wiring pattern. Further, if the process is so arranged that a poorly soldered connection is resoldered when it is found, such a process is preferable to establish an automatic operation process for correcting unsoldered or poorly soldered connection.

FIGS. 5(a) and 5(b) show sectional views of FIG. 1 respectively but other distinguishing means, as shown in the above described embodiment, can be used for detecting unsoldered or poorly soldered connection. This point has been confirmed by the present inventors.

In the embodiments described above, distinguishing means 10 and 11 is formed with the pattern 2 at the production process of wiring, but the distinguishing means may be formed by laser processing by applying laser beams on the pattern 2 to evaporate conductive material thereof.

In such printed wiring patterns as described above in the embodiments according to the present invention, poorly soldered or unsoldered connections between printed patterns and lead terminals can be easily detected by visual inspection or automatic checking method.

We claim:

1. A printed wiring pattern for a printed circuit board to be treated by reflow soldering comprising:
   an electrically insulating substrate; and
   a conductive pattern for connecting a lead terminal of a surface mounting component and an electric wiring of a circuit and wherein:
   said pattern provided on a surface of said substrate has a distinguishing means at which conductive material is not formed so as to expose the surface of said substrate; and
   said distinguishing means is located in said pattern at a distance from an end of said lead terminal which is only attained by molten solder as it flows expandingly on said pattern when a poorly soldered connection is formed between the pattern and the lead terminal, said distinguishing means having a predetermined width such that the molten solder can flow over at least a part of said distinguishing means when said lead terminal is not connected with said pattern by solder.

2. A printed wiring pattern for a printed circuit board to be treated by reflow soldering according to claim 1 wherein, said distinguishing means is a rectangular shape.

3. A printed wiring pattern for a printed circuit board to be treated by reflow soldering according to claim 1 wherein, said distinguishing means is a circular shape.

* * * * *